United States Patent
Bhattacharya et al.

(10) Patent No.: US 7,106,107 B2
(45) Date of Patent: Sep. 12, 2006

(54) RELIABILITY COMPARATOR WITH HYSTERESIS

(75) Inventors: Dipankar Bhattacharya, Macungie, PA (US); John Christopher Kriz, Palmerton, PA (US); Bernard L. Morris, Emmaus, PA (US); William B. Wilson, Macungie, PA (US)

(73) Assignee: Agere Systems Inc., Allentown, PA (US)

( * ) Notice: Subject to any disclaimer, the term of this patent is extended or adjusted under 35 U.S.C. 154(b) by 28 days.

(21) Appl. No.: 11/047,388

(22) Filed: Jan. 31, 2005

(65) Prior Publication Data

US 2006/0170462 A1 Aug. 3, 2006

(51) Int. Cl.
*H03K 5/22* (2006.01)

(52) U.S. Cl. .............................. 327/77; 327/206; 327/87
(58) Field of Classification Search ................. 327/77, 327/78, 87, 205, 206
See application file for complete search history.

(56) References Cited

U.S. PATENT DOCUMENTS 5,894,423 A * 4/1999 Ling et al. ..................... 327/77
6,943,592 B1 * 9/2005 Degoirat et al. ............... 327/77

* cited by examiner

*Primary Examiner*—Long Nguyen

(57) ABSTRACT

A comparator circuit includes a reference generator connecting to a first source providing a first voltage. The reference generator is operative to generate a reference signal and includes a control circuit selectively operable in at least a first mode or a second mode in response to a first control signal, wherein in the first mode the reference signal is not generated, and in the second mode the reference generator is operative to generate the reference signal. The comparator circuit further includes a comparator connecting to a second source providing a second voltage, the second voltage being less than the first voltage. The comparator is operative to receive the reference signal and an input signal, and to generate an output signal which is a function of a comparison between the input signal and the reference signal. A hysteresis circuit is included in the comparator circuit for selectively controlling a switching threshold of the comparator, relative to the input signal, as a function of the output signal of the comparator. The comparator circuit includes a voltage clamp operative to limit a voltage applied to one or more devices in the control circuit, the comparator, and/or the hysteresis circuit to less than the second voltage.

20 Claims, 3 Drawing Sheets

RELIABILITY COMPARATOR WITH HYSTERESIS

FIELD OF THE INVENTION

The present invention relates generally to electronic circuits, and more particularly relates to techniques for improving the reliability of comparator circuits having hysteresis and being operable in a reduced power mode.

BACKGROUND OF THE INVENTION

Analog comparators are well known in the art. A comparator is a circuit which compares an analog signal with another analog signal, and outputs a binary signal based on the result of the comparison. What is meant here by an analog signal is a signal that can have one of a continuum of amplitude values at any given point in time. In many applications, it is desirable to provide a binary output signal indicating when an analog input signal is above or below a predefined reference level. In this scenario, a substantially fixed reference voltage is applied to one of the inputs of the comparator, and the other input of the comparator receives the analog input signal to be compared. The output signal generated by the comparator will be a binary signal representing whether the input signal is greater than or less than the reference voltage level.

FIG. 1 is a schematic diagram depicting a conventional comparator circuit 100 in which an input signal A is applied to a non-inverting (+) input of a comparator X1, and a reference voltage VREF is applied to an inverting (−) input of the comparator. An output signal Z of the comparator will be a logical "1" whenever the voltage level of signal A is above VREF and a logical "0" whenever signal A is below VREF. In the comparator circuit 100, the reference voltage is generated by a simple voltage divider comprising resistors R1 and R2 connected together in series between a positive voltage supply VDD, which may be, for example, 3.3 volts, and a negative voltage supply VSS, which may be ground. Assuming VSS is equal to zero, the value of VREF will be dependent upon the value of resistors R1, R2, and the value of voltage supply VDD, according to the following relation:

$$VREF = VDD \times \frac{R2}{R1 + R2}$$

Often, a comparator is employed in a noisy environment in which it must detect signal transitions at or near a threshold region of the comparator. In order to prevent glitches from being generated in the output signal during noisy transitions of the input signal as the input signal passes through the threshold region of the comparator, the conventional comparator circuit 100 may be modified by adding hysteresis. Hysteresis is generally a characteristic of the comparator circuit in which the input threshold changes as a function of the input (or output) signal level. There are numerous known techniques for adding hysteresis to a comparator circuit, one of simplest being the use of an additional resistor and transistor, as illustrated in FIG. 2.

FIG. 2 is a schematic diagram depicting a standard comparator circuit 200 including hysteresis. Comparator circuit 200 is essentially the same as comparator circuit 100 shown in FIG. 1, with the addition of a resistor R3 and an n-type metal-oxide semiconductor (NMOS) transistor M1 having a gate terminal (G) for receiving the output signal Z of the comparator X1, a drain terminal (D) connected to a first end of resistor R3 at node n1, and a source terminal (S) connected to a second end of R3, which is coupled to VSS. The operation of the comparator circuit 200 is such that when input A is much less than VREF, output signal Z will be low, and thus transistor M1 will be turned off. Assuming VSS is zero, the value of VREF will then be determined according to the relation:

$$VREF = VREF1 = VDD \times \frac{R2 + R3}{R1 + R2 + R3}$$

As input signal A rises above VREF1, output signal Z will go high, thus turning on transistor M1. Assuming M1 has an on-resistance that is substantially less than the resistance of R3, a new reference voltage level VREF2 will be established for the comparator circuit 200 according to the relation:

$$VREF = VREF2 = VDD \times \frac{R2}{R1 + R2}$$

The new reference voltage level VREF2 will be lower than VREF1. Thus, when the input signal A passes a switching threshold of the comparator, set primarily by VREF, the output signal Z changes state and the threshold level is subsequently reduced, so that the input signal A must return beyond the previous threshold point before the output of the comparator will change state again.

Unfortunately, the comparator circuits shown in FIGS. 1 and 2 employ a voltage reference that always consumes direct current (DC) power, at least through the series resistor string (assuming the supply voltage VDD is greater than VSS). Consequently, although a resistance of the resistor string can be made substantially high (e.g., on the order of mega ohms) so as to help minimize power consumption, these comparator circuits may not meet low-power specifications for some applications, including, for example, portable applications utilizing battery-powered devices. Moreover, certain specifications, such as, for example, a Universal Serial Bus (USB) On-The-Go (OTG) specification (see, e.g., "On-The-Go Supplement to the USB 2.0 Specification," Rev. 1.0a, USB Implementers Forum, Inc., June 2003, the disclosure of which is incorporated by reference herein), may require a comparator circuit fabricated using a lower voltage (e.g., 3.3 volts) integrated circuit (IC) process technology to be able to work reliably with input signals referenced to a higher voltage source (e.g., 5 volts). To accomplish this, the voltage VREF, which is used to control the switching threshold of the comparator X1, should be referenced to the higher voltage source. This higher voltage source, however, often exceeds a specified maximum voltage level for the IC process, which can undesirably reduce the reliability of the comparator circuit by overstressing transistor devices in the comparator circuit. Previous attempts to address this problem have typically involved including a precision voltage reference in the comparator circuit for providing a well-controlled (e.g., plus or minus one percent) reference voltage source, thus adding significant cost to the comparator circuit.

A need exists, therefore, for an improved comparator circuit having hysteresis and reduced power consumption, which does not suffer from one or more of the problems exhibited by conventional comparator circuits.

SUMMARY OF THE INVENTION

The present invention meets the above-noted need by providing, in an illustrative embodiment, an improved comparator circuit with hysteresis that is preferably operable in a low-power mode for reducing power consumption therein. The comparator circuit is advantageously capable of being operated with a reference generator which is referenced to a voltage that exceeds a specified maximum voltage limit of the IC process technology used to fabricate the comparator circuit. The comparator circuit includes a voltage clamp for limiting the voltage on any device in the comparator circuit to less than or equal to the specified maximum voltage limit of the IC process, thereby beneficially improving a reliability of the comparator circuit.

In accordance with one aspect of the invention, a comparator circuit includes a reference generator connecting to a first source providing a first voltage. The reference generator is operative to generate a reference signal and includes a control circuit selectively operable in at least a first mode or a second mode in response to a first control signal, wherein in the first mode the reference signal is not generated, and in the second mode the reference generator is operative to generate the reference signal. The comparator circuit further includes a comparator connecting to a second source providing a second voltage, the second voltage being less than the first voltage. The comparator is operative to receive the reference signal and an input signal, and to generate an output signal which is a function of a comparison between the input signal and the reference signal. A hysteresis circuit is included in the comparator circuit for selectively controlling a switching threshold of the comparator, relative to the input signal, as a function of the output signal of the comparator. The comparator circuit includes a voltage clamp operative to limit a voltage applied to one or more devices in the control circuit, the comparator, and/or the hysteresis circuit to less than the second voltage.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of illustrative comparator circuits. It should be understood, however, that the present invention is not limited to these or any particular comparator circuit arrangements. Rather, the invention is more generally applicable to techniques for reducing DC current consumption in a comparator circuit without significantly increasing power-up delay in the bias circuit. Furthermore, although implementations of the present invention are described herein with specific reference to n-type metal-oxide semiconductor (NMOS) transistor devices, as may be formed using a complementary metal-oxide semiconductor (CMOS) fabrication process, it is to be appreciated that the invention is not limited to such transistor devices and/or to such a fabrication process, and that other suitable devices, such as, for example, p-type metal-oxide semiconductor (PMOS) transistors, bipolar junction transistors, etc., and/or fabrication processes (e.g., bipolar, BiCMOS, etc.), may be similarly employed, as will be understood by those skilled in the art.

Figure 1:
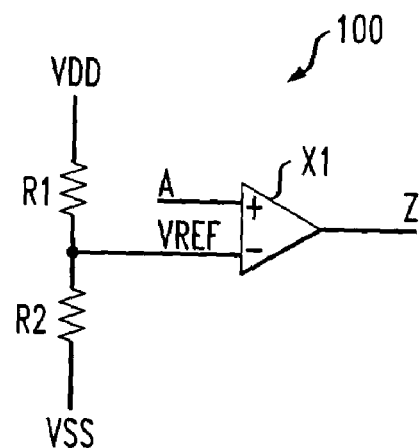
FIG. 1 is a schematic diagram depicting a conventional comparator circuit.
Figure 2:
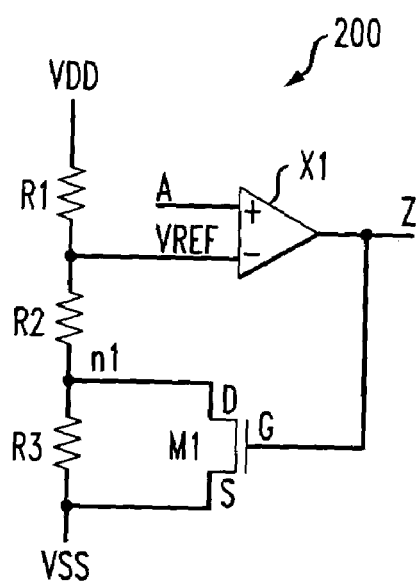
FIG. 2 is a schematic diagram depicting a conventional comparator circuit including hysteresis.
Figure 3:
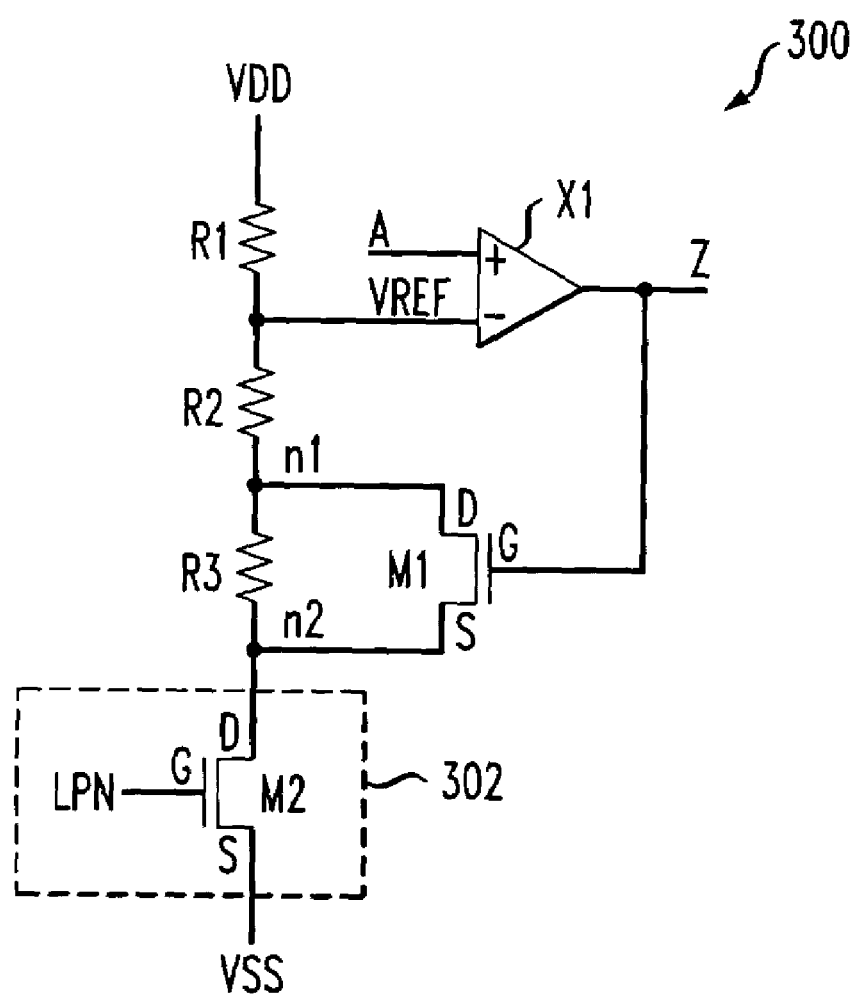
FIG. 3 is a schematic diagram illustrating an exemplary comparator circuit with hysteresis, wherein the comparator circuit includes a reference generator which is operative in a low-power mode.

FIG. 3 is a schematic diagram illustrating an exemplary comparator circuit 300. The comparator circuit preferably comprises a comparator X1. An input signal A is applied to a non-inverting (+) input of the comparator X1, and a reference signal VREF is applied to an inverting (−) input of the comparator. The reference signal VREF may be generated by a string of series-connected resistors R1, R2 and R3 coupled between VDD and VSS. Like the comparator circuit 200 shown in FIG. 2, the illustrative comparator circuit 300 is operative to provide hysteresis via resistor R3 and an NMOS transistor device M1 connected across resistor R3. Specifically, a drain terminal of transistor M1 is connected to a first end of resistor R3 at node n1, a source terminal of M1 is connected to a second end of resistor R3 at node n2, and a gate terminal of M1 is connected to an output Z of comparator X1. NMOS device M1 is preferably sized such that an on-resistance of M1 is substantially less than a resistance of R3, such that R3 is essentially electrically shorted when M1 is turned on.

It is to be appreciated that, because a metal-oxide semiconductor (MOS) device is symmetrical in nature, and thus bidirectional, the assignment of source and drain designations in the MOS device is essentially arbitrary. Therefore, the source and drain terminals may be referred to herein generally as first and second source/drain terminals, respectively, where the term "source/drain" in this context denotes a source terminal or a drain terminal.

In order to reduce DC power consumption in the comparator circuit 300, the resistor string, comprising resistors R1, R2 and R3, may include a control circuit 302 connected in series with the resistor string, between resistor R3 and VSS. The control circuit 302 may comprise an NMOS transistor device M2, having a drain terminal connected to an end of resistor R3 at node n2, a source terminal connected to VSS, and a gate terminal for receiving an enable signal LPN. The control circuit 302 is preferably configured such that when the signal LPN is asserted (e.g., logic "0"), such as during a low-power mode of operation, transistor M2 is turned off, thereby preventing current from flowing through the resistors R1, R2, R3. Likewise, during a normal mode of operation, signal LPN is not asserted (e.g., logic "1"), thereby turning on transistor M2 and allowing current to flow through the resistor string. Transistor M2 is preferably sized so as to have an on-resistance that is substantially lower (e.g., less than about ten ohms) than the resistances of resistors R1, R2 and R3, and thus does not significantly affect the value of VREF presented to the comparator.

As previously stated, in certain applications in which the comparator circuit may be used, it may be necessary to reference the voltage VREF, generated by the resistor string, to a voltage source having a potential that exceeds a specified maximum voltage for the IC process technology used to fabricate the comparator circuit. This maximum specified voltage is generally about ten percent above the stated process voltage. Thus, for a 3.3-volt IC process, the maximum specified voltage is typically about 3.6 volts in order to avoid potentially damaging transistor devices in the comparator circuit 300. When the resistor string is connected to a voltage supply (e.g., VDD) which is higher in potential than the specified maximum voltage for the IC process, during normal operation the comparator circuit 300 should work sufficiently well, assuming the resistor values for R1, R2 and R3 are selected so that the reference voltage VREF does not exceed the maximum specified voltage. However, when the comparator circuit 300 is operated in a low-power mode, transistor M2 is turned off, thereby allowing nodes VREF, n1 and n2 to be pulled up to VDD, which as previously stated may be substantially higher (e.g., 5 volts) than the specified maximum voltage (e.g., 3.6 volts) of the process. This places excessive voltage stress on certain devices in the comparator circuit 300, such as, for example, transistor devices forming an input stage of the comparator X1, and transistor devices M1 and M2, which can undesirably reduce the reliability of the comparator circuit.

Figure 4:
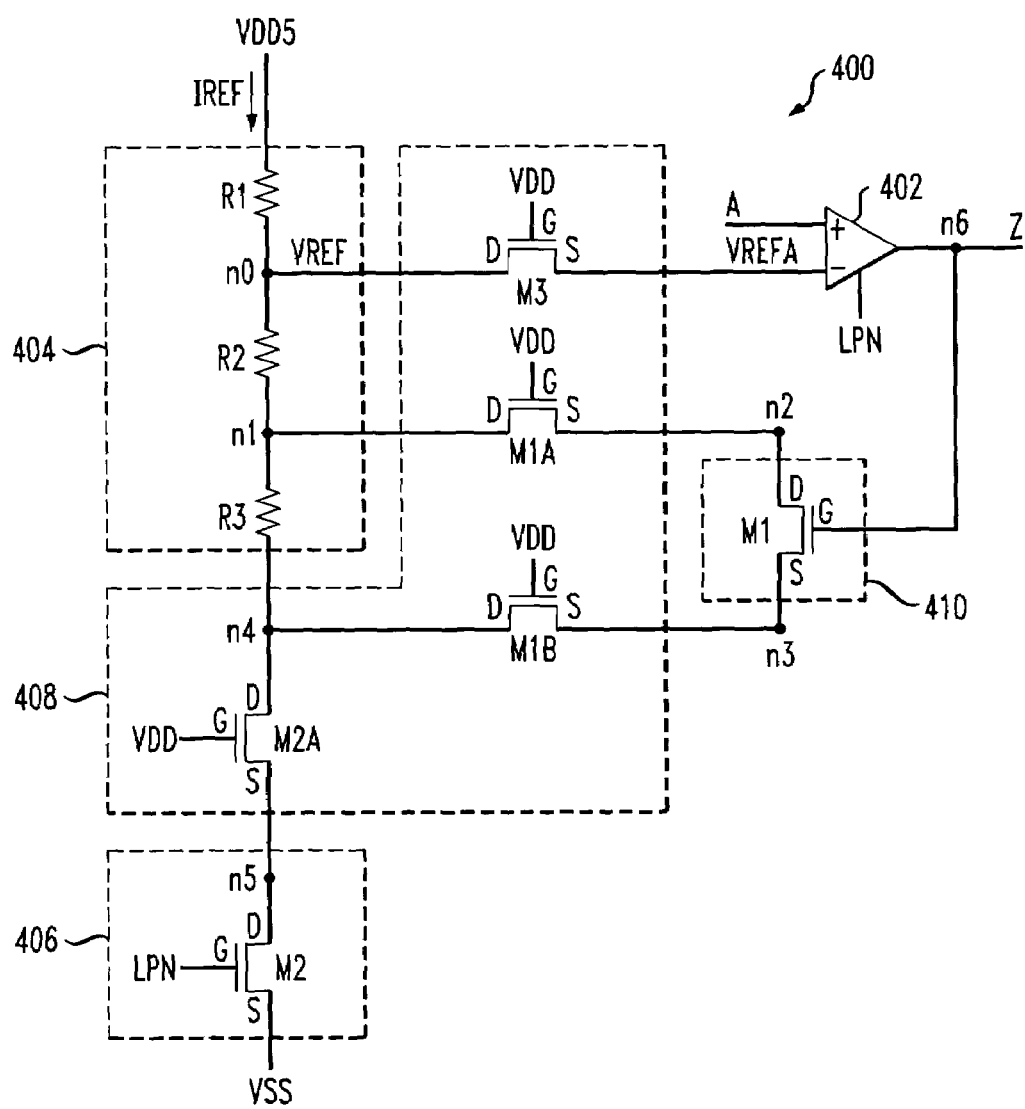
FIG. 4 is a schematic diagram illustrating an exemplary comparator circuit, formed in accordance with an embodiment of the present invention.

FIG. 4 is a schematic diagram depicting an exemplary comparator circuit 400 in which the techniques of the present invention are implemented, in accordance with an illustrative embodiment thereof. The exemplary comparator circuit 400 includes a comparator 402 having a first input, which may be a non-inverting (+) input, for receiving an input signal A, a second input, which may be an inverting (−) input, for receiving a reference signal VREF, and an output at node n6 for generating an output signal Z. Comparator 402 may be implemented in accordance with a standard comparator (e.g., a differential comparator), as described, for example, in the text by PHILLIP E. ALLEN & DOUGLAS R. HOLBERG, CMOS ANALOG CIRCUIT DESIGN 439–491 (Oxford University Press 2d ed. 2002) (1987), the disclosure of which is incorporated by reference herein.

Like the comparator circuit 300 shown in FIG. 3, the reference signal VREF is preferably produced by a reference generator 404 which, in one configuration, comprises a plurality of resistors R1, R2 and R3 connected in series between a first voltage source VDD5, which may be, for example, 5 volts, and a second voltage source VSS, which may be ground, although the invention is not limited to any specific voltage(s). The series arrangement of resistors R1, R2 and R3 may be referred to herein as a resistor string. Specifically, a first end of resistor R1 is preferably connected to VDD5, a second end of R1 is connected to a first end of resistor R2 at node n0, and a second end of R2 is connected to a first end of resistor R3 at node n1. It is to be understood that the invention is not limited to the particular reference generator circuit arrangement shown. Furthermore, one or more of the resistors R1, R2, R3 in reference generator 404 may comprise alternative resistance elements (e.g., active resistors), such as, for example, NMOS transistor devices, PMOS transistor devices, etc., as will be known by those skilled in the art.

Comparator circuit 400 preferably includes a hysteresis circuit 410, which, in at least one aspect, functions to substantially eliminate glitches in the output signal Z generated during noisy transitions of the input signal A about a switching threshold of the comparator 402. The invention contemplates various methodologies for implementing the hysteresis circuit 410. One simple technique for providing hysteresis is to selectively control the reference voltage level VREF as a function of the output signal Z of the comparator 402. For example, in one embodiment of the invention, hysteresis circuit 410 comprises an NMOS transistor device M1 configured so as to selectively electrically short a resistor in the reference generator 404 (e.g., R3) in response to output signal Z, or in response to an alternative signal which is representative of the logical state of the comparator 402. Specifically, a drain terminal of transistor M1 may be operatively coupled to resistor R3 at node n1, a source terminal of M1 may be operatively coupled to a second end of R3 at node n4, and a gate terminal of M1 may be connected to the output of the comparator 402 at node n6. Thus, when the input signal A passes the switching threshold of the comparator 402, set primarily by VREF, the output Z changes state and the threshold level is subsequently reduced, by shorting out resistor R3, so that the input A must return beyond the previous threshold point before the output Z of the comparator will change state again.

Like comparator circuit 300 depicted in FIG. 3, the exemplary comparator circuit 400 includes a control circuit 406 for reducing DC power consumption in the comparator circuit. Control circuit 406 is preferably connected in series with the reference generator 404, between resistor R3 and VSS. Although depicted as a separate functional block, the control circuit 406 may alternatively be incorporated into one or more other functional blocks, such as, for example, the reference generator 404. In a preferred embodiment, control circuit 406 comprises an NMOS transistor M2 having a drain terminal operatively coupled to the second end of resistor R3, a source terminal connected to VSS, and a gate terminal for receiving an enable signal LPN. Alternative connection arrangements for the control circuit 406 are similarly contemplated. For example, the control circuit 406 may be connected between the reference generator 404 and VDD5, although this circuit arrangement may significantly increase a complexity of the control circuit.

The control circuit 406 is preferably configured such that when the signal LPN is asserted (e.g., logic "0"), such as during a low-power mode of operation, transistor M2 is turned off, thereby preventing a current IREF from flowing through the reference generator 404. Thus, in the low-power mode of operation, the control circuit 406 disables at least a portion of the reference generator 404 such that the reference signal VREF is not generated. Likewise, during a normal mode of operation, signal LPN is not asserted (e.g., logic "1"), thereby turning on transistor M2 and allowing current IREF to flow through the reference generator 404. Thus, in the normal mode of operation, the reference signal VREF is generated. Transistor M2 is preferably sized so as to have an on-resistance that is substantially lower (e.g., less than about 10 ohms) than the resistances of resistors R1, R2 and R3, and thus does not significantly affect the value of reference signal VREF presented to the comparator 402.

As previously stated, during the low-power mode of operation, the reference signal VREF is not generated, preferably by reducing the current IREF in reference generator 404 to zero. As a result, nodes n0, n1 and n4 in the reference generator 404 will be pulled up to VDD5 (e.g., 5 volts), which may exceed the specified maximum voltage (e.g., about 3.6 volts) of the IC process used to fabricate the comparator circuit 400. Since the comparator 402, the control circuit 406 and hysteresis circuit 410 are all coupled to one or more of these nodes n0, n1, n4, transistor devices in one or more of these circuit components (e.g., input stage devices in comparator 402, transistors M1 and M2) should be protected from over-voltage stresses which could undesirably impact a reliability of the comparator circuit 400.

In order to improve a reliability of the comparator circuit 400, primarily by reducing over-voltage stresses on certain devices in the circuit, the comparator circuit preferably includes a voltage clamp 408. The voltage clamp 408 is preferably operative to limit a voltage applied to one or more circuit components in the comparator circuit 400, namely, the comparator 402, control circuit 406, and hysteresis circuit 410. In an illustrative embodiment of the invention, the voltage clamp 408 comprises first and second NMOS transistors M1A and M1B, respectively, for limiting the voltage on either side of the hysteresis circuit 410, a third NMOS transistor M2A for limiting the voltage applied to the control circuit 406, and a fourth NMOS transistor M3 for limiting the voltage applied to the comparator 402. Specifically, a drain terminal of transistor M1A is preferably connected to the reference generator 404 at node n1, a source terminal of M1A is connected to the drain terminal of transistor M1 in hysteresis circuit 410 at node n2, a drain terminal of transistor M1B is connected to the reference generator at node n4, and a source terminal of M1B is connected to the source terminal of M1 at node n3. A drain terminal of transistor M2A is connected to the reference generator 404 at node n4, and a source terminal of M2A is connected to the drain terminal of transistor M2 in control circuit 406 at node n5. A drain terminal of transistor M3 is preferably connected to the reference generator 404 at node n0, and a source terminal of M3 is connected to an input, which may be the inverting input, of comparator 402 at node VREFA.

Gate terminals of each of the protection transistors M1A, M1B, M2A and M3, are preferably connected to a third voltage source, which may be VDD (e.g., 3.3 volts). The third voltage source has a potential which is less than VDD5, to which the reference generator 404 may be referenced. Configured in this manner, the protection transistors M1A, M1B, M2A and M3 essentially act as source follower devices, limiting a voltage at nodes n2, n3, n5 and VREFA, respectively, to a potential of VDD–VTN, where VTN is a threshold voltage of the NMOS devices MIA, M1B, M2A, M3. The potential of the third voltage source VDD is preferably selected so that no transistor device in the comparator circuit 400 experiences a voltage which exceeds the maximum specified voltage of the process, even during the low-power mode of operation.

To further reduce power consumption in the comparator circuit 400, the comparator 402 may optionally include additional control circuitry (not specifically shown) operative to selectively disable at least a portion of the comparator in response to a control signal, such as enable signal LPN, or an alternative control signal, presented thereto. For example, a bias circuit (not shown) included in the comparator 402 may be selectively turned off during the low-power mode of operation by the control signal, as will be understood by those skilled in the art.

At least a portion of the comparator circuit of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A comparator circuit, comprising:
a reference generator connecting to a first source providing a first voltage, the reference generator being operative to generate a reference signal and including a control circuit selectively operable in one of at least a first mode and a second mode in response to a first control signal applied to the reference generator, wherein in the first mode the reference signal is not generated, and in the second mode the reference generator is operative to generate the reference signal;
a comparator connecting to a second source providing a second voltage, the second voltage being less than the first voltage, the comparator being operative to receive the reference signal and an input signal, and to generate an output signal which is a function of a comparison between the input signal and the reference signal;
a hysteresis circuit operative to selectively control a switching threshold of the comparator, relative to the input signal, as a function of the output signal of the comparator; and
a voltage clamp operative to limit a voltage applied to at least one of the control circuit, the comparator, and the hysteresis circuit to less than the second voltage.

2. The circuit of claim 1, wherein the reference generator comprises a plurality of resistors connected in series between the first source and a third source providing a third voltage, the third voltage being less than the first voltage, a level of the reference signal being controlled at least in part as a function of values of the resistors.

3. The circuit of claim 1, wherein the reference generator comprises at least first, second and third resistors having first, second and third resistances, respectively, associated therewith, the first resistor connecting at a first end to the first source, a second end of the first resistor being connected to a first end of the second resistor at a first node, a second end of the second resistor being connected to a first end of the third resistor at a second node, and a second end of the third resistor being connected to the control circuit, the reference signal being generated at the first node, a level of the reference signal being controlled at least in part as a function of values of at least one of the first, second and third resistors.

4. The circuit of claim 3, wherein the hysteresis circuit is operative to selectively connect a substantially low-resistance electrical path across at least one of the second and third resistors in response to a second control signal, the second control signal being a function of the output signal of the comparator.

5. The circuit of claim 3, wherein the hysteresis circuit is configured such that when the output signal of the comparator is a first logic level, the reference signal has a level that is a function of a ratio of the second resistance to a sum of the first and second resistances, and when the output signal is a second logic level, the reference signal has a level that is a function of a ratio of a sum of the second and third resistances to a sum of the first, second and third resistances.

6. The circuit of claim 3, wherein the control circuit comprises a transistor including a first source/drain terminal connected to the second end of the third resistor, a second source/drain terminal connecting to a third source providing a third voltage, and a gate terminal for receiving the first control signal, the first voltage being greater than the third voltage.

7. The circuit of claim 1, wherein the voltage clamp comprises at least first, second, third and fourth transistors, each transistor including first and second source/drain terminals and a gate terminal, the gate terminals of each of the transistors connecting to the second source, the first source/drain terminal of the first transistor receiving the reference signal, the second source/drain terminal of the first transistor being connected to the comparator, the first source/drain terminal of the second transistor being connected to a first node of the reference generator, the second source/drain terminal of the second transistor being connected to a first node of the hysteresis circuit, the first source/drain terminal of the third transistor being connected to a second node of the hysteresis circuit, the second source/drain terminal being connected to a second node of the reference generator, the first source/drain terminal of the fourth transistor being connected to the second node of the reference generator, and the second source/drain terminal of the fourth transistor being connected to the control circuit.

8. The circuit of claim 7, wherein each of the first, second, third and fourth transistors in the voltage clamp comprises an n-type metal-oxide semiconductor device.

9. The circuit of claim 1, wherein the control circuit comprises at least one transistor having a first source/drain terminal connected to the reference generator, a second source/drain terminal connecting to a third source providing a third voltage, the first voltage being greater than the third voltage, and a gate terminal for receiving the first control signal, the at least one transistor being turned off during the first mode of operation and being turned on during the second mode of operation.

10. The circuit of claim 9, wherein the at least one transistor in the control circuit comprises an n-type metal-oxide semiconductor device.

11. The circuit of claim 1, wherein the hysteresis circuit comprises a transistor including a first source/drain terminal connected to a first node of the reference generator, a second source/drain terminal connected to a second node of the reference generator, and a gate terminal for receiving a second control signal which is a function of the output signal of the comparator, the transistor electrically connecting the first and second nodes of the reference generator together when the output signal is a first level, and the transistor being turned off when the output signal is a second level.

12. The circuit of claim 11, wherein the second control signal comprises the output signal generated by the comparator.

13. The circuit of claim 1, wherein the first voltage is about five volts and the second voltage is about 3.3 volts.

14. The circuit of claim 1, wherein the comparator comprises control circuitry operative to selectively disable at least a portion of the comparator so as to reduce a power consumption of the comparator during the first mode of operation.

15. The circuit of claim 1, wherein the voltage clamp comprises at least first, second, third and fourth transistors, gate terminals of each of the first, second, third and fourth transistors connecting to a third source providing a third voltage, the first voltage being greater than the third voltage, a first source/drain terminal of the first transistor receiving the reference signal, a second source/drain terminal of the first transistor being connected to the comparator, a first source/drain terminal of the second transistor being connected to a first node of the reference generator, a second source/drain terminal of the second transistor being connected to a first node of the hysteresis circuit, a first source/drain terminal of the third transistor being connected to a second node of the hysteresis circuit, a second source/drain terminal being connected to a second node of the reference generator, a first source/drain terminal of the fourth transistor being connected to the second node of the reference generator, and a second source/drain terminal of the fourth transistor being connected to the control circuit.

16. An integrated circuit including at least one comparator circuit, the at least one comparator circuit comprising:

a reference generator connecting to a first source providing a first voltage, the reference generator being operative to generate a reference signal and including a control circuit selectively operable in one of at least a first mode and a second mode in response to a first control signal applied to the reference generator, wherein in the first mode the reference signal is not generated, and in the second mode the reference generator is operative to generate the reference signal;

a comparator connecting to a second source providing a second voltage, the second voltage being less than the first voltage, the comparator being operative to receive the reference signal and an input signal, and to generate an output signal which is a function of a comparison between the input signal and the reference signal;

a hysteresis circuit operative to selectively control a switching threshold of the comparator, relative to the input signal, as a function of the output signal of the comparator; and a voltage clamp operative to limit a voltage applied to at least one of the control circuit, the comparator, and the hysteresis circuit to less than the second voltage.

17. The integrated circuit of claim 16, wherein the control circuit comprises at least one transistor having a first source/drain terminal connected to the reference generator, a second source/drain terminal connecting to a third source providing a third voltage, the first voltage being greater than the third voltage, and a gate terminal for receiving the first control signal, the transistor being turned off during the first mode of operation and being turned on during the second mode of operation.

18. The integrated circuit of claim 16, wherein the voltage clamp comprises at least first, second, third and fourth transistors, gate terminals of each of the first, second, third and fourth transistors connecting to a third source providing a third voltage, the first voltage being greater than the third voltage, a first source/drain terminal of the first transistor receiving the reference signal, a second source/drain terminal of the first transistor being connected to the comparator, a first source/drain terminal of the second transistor being connected to a first node of the reference generator, a second source/drain terminal of the second transistor being connected to a first node of the hysteresis circuit, a first source/drain terminal of the third transistor being connected to a second node of the hysteresis circuit, a second source/drain terminal being connected to a second node of the reference generator, a first source/drain terminal of the fourth transistor being connected to the second node of the reference generator, and a second source/drain terminal of the fourth transistor being connected to the control circuit.

19. The integrated circuit of claim 16, wherein the hysteresis circuit comprises a transistor including a first source/drain terminal connected to a first node of the reference generator, a second source/drain terminal connected to a second node of the reference generator, and a gate terminal for receiving a second control signal which is a function of the output signal of the comparator, the transistor electrically connecting the first and second nodes of the reference generator together when the output signal is a first level, and the transistor being turned off when the output signal is a second level.

20. The integrated circuit of claim 16, wherein the comparator comprises control circuitry operative to selectively disable at least a portion of the comparator so as to reduce a power consumption of the comparator during the first mode of operation.

* * * * *